United States Patent [19]

Ward et al.

[11] Patent Number: 4,992,108
[45] Date of Patent: Feb. 12, 1991

[54] PHOTORESIST STRIPPING COMPOSITIONS

[76] Inventors: Irl E. Ward, 1526 Leon Dr., Hatfield, Pa. 19440; Francis W. Michelotti, 3560 Southwood Dr., Easton, Pa. 18042

[21] Appl. No.: 466,758

[22] Filed: Jan. 18, 1990

[51] Int. Cl.$^5$ .................. C11D 1/12; C23G 1/02
[52] U.S. Cl. ........................ 134/38; 252/142; 252/171; 430/329
[58] Field of Search ............ 134/38; 252/142, 171, 252/558, DIG. 8; 430/329

[56] References Cited

U.S. PATENT DOCUMENTS

| | | | |
|---|---|---|---|
| 4,070,203 | 1/1978 | Neisius | 134/38 |
| 4,165,294 | 8/1979 | Vander Mey | 134/38 |
| 4,165,295 | 8/1979 | Vander Mey | 134/38 |
| 4,215,005 | 7/1980 | Vander Mey | 134/38 |
| 4,221,674 | 9/1980 | Vander Mey | 134/38 |
| 4,242,218 | 12/1980 | Vander Mey | 134/38 |
| 4,395,348 | 7/1983 | Lee | 134/38 |
| 4,491,530 | 1/1985 | Thomas | 252/171 |
| 4,881,798 | 11/1989 | Yuasa | 350/355 |
| 4,944,893 | 7/1990 | Tanaka | 252/171 |

Primary Examiner—Olik Chaudhuri
Assistant Examiner—Ourmazd S. Ojan
Attorney, Agent, or Firm—John Lezdey

[57] ABSTRACT

A non-aqueous biodegradable negative photoresist stripping composition having low toxicity and is operable at temperatures at 85° C. or less which comprises about 85% by weight of an aromatic hydrocarbon solvent of the formula selected from the group consisting of:

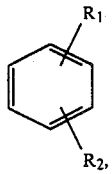

I

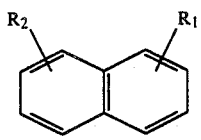

II and

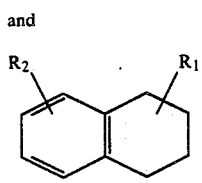

III wherein $R_1$ and $R_2$ are the same or different and each is a member selected from the group consisting of methyl, ethyl n-propyl and isopropyl, and an organic sulfonic acid of the formula:

$R_3-SO_3H$ wherein $R_3$ is a member selected from the group consisting of phenyl, tolyl, dodecylbenzene and naphthyl, the ratio of the aromatic solvent to organic solvent acid being about 60 to 96% by weight to about 4 to 40% by weight.

10 Claims, No Drawings

PHOTORESIST STRIPPING COMPOSITIONS

FIELD OF THE INVENTION

This invention relates to photoresist stripping compositions. More particularly, the invention relates to a non-aqueous biodegradable negative photoresist stripping composition having low toxicity, which can be utilized at lower operating temperatures and can be easily rinsed away with water.

BACKGROUND OF THE INVENTION

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the substrate, e.g. silicon, $SiO_2$ or while such etchant selectively attacks the unprotected area of the substrate. Following completion of the etching operation and washing away of the residual etchant, it is necessary that the resist be removed from the protective surface to permit essential finishing operations.

It is necessary in a photolithographic process that the photoresist material, following pattern delineation, be evenly and completely removed from all unexposed areas, in the case of positive resists, or exposed areas in the case of negative resists, so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

A common method used in removing the photoresist from the substrate is by contacting the substract with an organic stripper. Heretofore these organic strippers have been composed of various components whose purpose it was to lift and remove the polymeric photoresist from the substrate. However, these stripping solutions have heretofore usually contained phenol or phenol compounds and chlorinated hydrocarbon compounds which resulted in a distinct disadvantage due to the toxicity of phenol as well as the pollution problems arising from the disposal of phenol or phenol compounds such as cresols, phenol sulfonic acid and the like or the disposal of chlorinated hydrocarbon compounds.

Phenol-free and chlorinated hydrocarbons-free strippers are described in U.S. Pat. No. 4,070,203 (issued Jan. 24, 1978 to Neisus et al). These strippers, having only an alkylbenzenesulfonic acid component of 12-20 carbons and a chlorine-free, aromatic hydrocarbon component with a boiling point about 150° C., suffer from the disadvantage that they cannot be easily rinsed off the inorganic substrate after stripping with aqueous rinsing materials such as deionized water. Instead organic solvents are required to avoid either the polymer or the aromatic solvent precipitating or forming oil beads, respectively, or, if water is used, copious amounts are required. The formation of oil beads is called "oiling out" and may lead to an undesirable oily layer remaining on the inorganic substrate.

There are various and numerous drawbacks and disadvantages with the prior art materials. Among the one or more drawbacks and disadvantages found in the use of each such stripping agents there may be mentioned the following: undesirable flammability, volatility, odor and toxicity; incomplete removal of all resist film; effectiveness only on certain resist films; attack of metal substrates by the stripping agent, safety in handling and disposal of the stripper; and the undesired necessity for use at specified elevated temperatures when selected resists are being stripped. Furthermore, the limited stripping capabilities of the stripping agents are a very decided drawback. Additionally, many such strippers are not sufficiently effective against resist materials that are subject to a severe post-baking operation thereby limiting their usefulness. In some of the strippers the presence of water is extremely detrimental. Additionally, for those stripping applications requiring inertness of the agent to metal substrates, toxicity during handling and difficulty of disposal are primary drawbacks.

OSHA, EPA and other similar federal, state and local governmental regulatory agencies have advocated a shift toward use of more human and environmentally compatible stripping compositions and stripping methods that are not subject to the aforementioned drawbacks and problems.

Moreover, heretofore available stripping compositions have required unduly long residence times or repeated applications in order to remove certain coatings. In addition, various coatings have resisted removal from certain substrates with these heretofore available stripping compositions. That is, these previously available stripping compositions have not provided adequate or complete removal of certain hard-to-remove coatings from various substrates.

It is, therefore, highly desirable to provide stripping compositions that exhibit substantially no human or environmental toxicity, and are biodegradable. It is also desirable to provide stripping compositions that are substantially non-corrosive, evidence relatively little, if any, tendency to evaporate and are generally unreactive and also of little toxicity to humans and are environmentally compatible. It would also be most desirable to provide stripping compositions that are recyclable, if desired, and thus available for extended bath life and multiple use.

Moreover, it would be desirable to provide stripping compositions that have a high degree of stripping efficacy and particularly such high degree of stripping efficacy at lower temperatures than generally required with prior stripping compositions.

It is also highly desirable that stripping compositions be provided that exhibit very low vapor pressure at elevated temperatures, thereby significantly reducing evaporation and thus contamination of the atmosphere.

Additionally, it is highly desirable that such compositions be provided that are effective and efficient stripping compositions for removal of coatings from substrates that heretofore have resisted ready removal with conventionally available strippers.

It is also desirable that effective stripping compositions be provided that are devoid of undesirable chlorinated or phenolic components and which do not require the use of hot caustic components. Highly desirable are stripping compositions and use thereof that are not considered undesirable by regulatory agencies overseeing their production and use.

U.S. Pat. No. 4,165,294 to John E. Vander Mey discloses a stripping solution free from phenol and chlorinated hydrocarbons comprising a surfactant, an alkylarylsulfonic acid and an aromatic hydrocarbon having a boiling point above 150° C. The aromatic hydrocarbons are optional and are preferably mixtures of aromatic solvents having 9-13 alkyl carbons and do not comprise more than 40 weight percent.

U.S. Pat. Nos. 4,426,311; 4,395,348; 4,304,681; 4,221,674; 4,215,005 and 4,165,295 each disclose the use of an organic sulfonic acid in a photoresist stripping composition. However, the organic sulfonic acid is utilized in combination with solvents having the aforementioned disadvantages.

It is an object of the invention to provide a non-aqueous biodegradable negative photoresist stripping composition which can be used at a wide range of operating conditions and at lower temperatures.

It is another object of this invention to provide a photoresist stripping solution which is essentially free of phenol, phenol compounds and chlorinated hydrocarbon compounds.

It is an additional object of this invention to provide such a solution which is substantially clean water rinseable such that the hydrocarbon solvent does not oil out and the polymer does not reprecipitate during rinsing.

It is an additional object of this invention to provide a method for removing photoresist polymeric coatings from inorganic substrates with such a stripping solution free from phenol, phenol compounds which can then be rinsed with an aqueous rinsing agent such as deionized water.

SUMMARY OF THE INVENTION

The present invention relates to a non-aqueous biodegradable negative photoresist stripping composition comprising a dialkylbenzene solvent and an aromatic sulfonic acid. More particularly, the stripping composition comprises at least about 85% by weight of a dialkyl aromatic hydrocarbon solvent of the formula selected from the group consisting of:

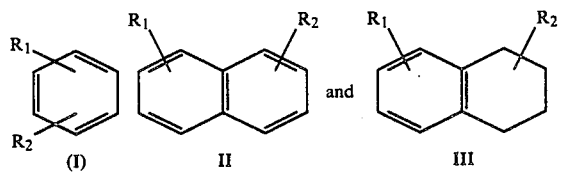

wherein $R_1$ and $R_2$ are the same or different and each is a member selected from the group consisting of methyl, ethyl, n-propyl and isopropyl, and an organic sulfonic acid of the formula:

$R_3SO_3H$, wherein $R_3$ is a member selected from the group consisting of phenyl, tolyl, dodecylbenzyl and naphthyl. It is essential that the component ratio of the aromatic solvent and the organic sulfonic acid is about 60 to 96 percent (%) by weight of aromatic solvent and about 4 to 40% by weight of organic sulfonic acid.

The stripping composition may comprise up to about 15% of other organic solvents which are biodegradable and have a low toxicity. Examples of other suitable solvents are alcohols of the formula: R OH, wherein R is an alkyl group of 6 to 13 carbon atoms; an ether of the formula: R'O R" wherein R' and R" each represent alkyl groups of 6 to 16 carbon atoms, $CH_3O-CH_2-CH_2-$ or isopropyl; cyclic ethers of the formula:

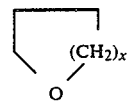

wherein x is 1 to 5; an amide of the formula:

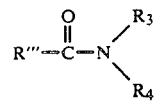

wherein R''' is an alkyl group of 1 to 4 carbon atoms, $R_3$ and $R_4$ each represent hydrogen or an alkyl group of 1 to 4 carbon atoms; a latcam of the formula:

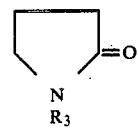

wherein $R_3$ is as hereinbefore defined, and a compound of the formula:

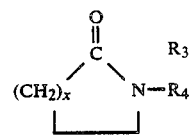

wherein x, $R_3$ and $R_4$ are as hereinbefore described.

The compositions of the invention can be used in stripping operations at a temperature of about 85° C. or less, preferably in the range of about 25° to 85° C.

DETAILED DESCRIPTION OF THE INVENTION

The present invention provides a composition which is effective in removing negative photoresists from an inorganic substrate, which composition is biodegradable, has a low toxicity and could be used over a wide temperature range and at low temperatures. While organic sulfonic acid have been previously used in stripping compositions, they have been used in combination with solvents that presented problems in disposal and use.

The organic sulfonic acids which have been found to be suitable for use in combination with the aromatic hydrocarbon solvents of the invention are selected from the group consisting of benzenesulfonic acid, tolylsulfonic acid, naphthylsulfonic acid and dodecylbenzene sulfonic acid. Most preferable of the organic sulfonic acids is dodecylbenzene sulfonic acid. Blends of the organic sulfonic acids may be employed but it is preferred that dodecylbenzene sulfonic acid be employed in the blend and comprises a major proportion of the organic sulfonic acids used in the blend.

The dialkyl aromatic hydrocarbon solvents which have been found to be effective in resulting in a composition which after use can easily be rinsed away with deionized water include diisopropyl benzene, dipropylbenzene, diethylbenzene, methylethyl benzene, ethylpropylbenzene dialkylaphthalene, dialkyltetrahydronaphthalene, and the like. Most preferable of the aromatic hydrocarbon solvents is diisopropylbenzene. The preferred combination of components comprises about 60 to 96% by weight of aromatic hydrocarbon solvent and about 4 to 40% by weight of organic sulfonic acid. The combination which has been found to be most effective comprises about 80% by weight of metadiisopropylbenzene and 20% by weight of dodecylbenzene sulfonic acid.

The stripping composition of the invention can comprise only the components of the aforementioned organic sulfonic acids and the aromatic hydrocarbon solvents. However, up to about 15% of the other hereinbefore mentioned biodegradable solvents may be added to the stripping composition without adversely affecting their stripping performance or their favorable characteristics. These additional solvents may be added to completely remove resist materials which have undergone a special treatment or where the resist materials does not comprise conventional materials. Preferably of the additional solvents which can be added include pentanol, heptanol, octanol, dipentyl ether, diheptyl ether, diglyme, 2-pyrrolidinone, 1-methyl-2-pyrrolidinone, 1,3-dimethyl naphthalene, 1,4-dimethyl naphthalene, tetrahydronaphthalene, cyclohexanol, decyl alcohol, dioctyl ether, N-methyl propionamide and 1-hydroxyethyl-2pyrrolidone.

The polymeric organic substances which are to be removed by the stripping solutions of the invention are photoresists which generally comprise polymers selected from relatively low molecular weight polyisoprenes, polyvinyl cinnamates and phenol formaldehyde resins. These photoresists are applied to a substrate, e.g., $SiO_2$, silicon or aluminum and portions are masked. The masked substrate is then exposed to light, e.g., a 120 volt 650 watt quartz lamp for 1–15 seconds at a distance of 6–12 inches to harden the exposed photoresist. The portion of the photoresist which is not exposed is removed by solvent development, thus leaving a pattern, e.g., a portion of an electrical circuit pattern, on the exposed substrate. The remaining photoresist is then baked for further hardening and the portion of the substrate which is not covered by the photoresist is etched or otherwise treated. The etchant may be a buffered oxide, acid or plasma etchant which may further harden the photoresist. The hardened photoresist must then be removed before the substrate can be further processed or used. In employing the stripping solutions of this invention, the substrate covered with the baked photoresist is contacted with the stripping solution at a temperature of from about 25° C. to about 85° C., preferably between 50° and 70° C. The period required for stripping the photoresist vary to quite an extent, depending on the specific polymer used in the photoresist and photoresist processing conditions. Generally, the time involved will be between 1 and 10 minutes, although some resists, depending upon the bake temperature, may require 15 minutes, 30 minutes or longer before the polymeric photoresist is loosened from the substrate. It should be appreciated that many photoresists are completely dissolved off of the substrate while others may be loosened, then floated off, and then dissolved in the stripping composition.

After the photoresist has been stripped from the substrate, the substrate is rinsed in any aqueous rinsing liquid. A solvent rinse may follow the stripping step, with solvents such as isopropanol, butylcellosolve or methylcellosolve being used. Since, however, the present compositions are substantially and cleanly water rinseable, it is acceptable to rinse with deionized water of the purity commonly found in semiconductor processing directly after stripping.

The stripping compositions of this invention are effective in stripping a wide and varied range of paints, enamels, lacquers, varnish, urethane coatings, powder and photoresist coatings and the like from various substrates such as wood or metal. As examples of wood or metal coatings that are stripped with the stripping compositions of this invention there may be mentioned, for examples, the following type coatings: linseed oil modified polyurethanes, white shellac, nitrocellulose coconut oil alkyds, acrylic modified alkyds, vinyl acetate/styrene/acrylic resins, tall oil-soya alkyds, soya-tung oil polyurethanes, tall oil linseed alkyds, epoxy paint, modified epoxy-ester resin paints, oil based enamels, alkyd enamels, marine varnishes, marine semi-gloss oil bases, latex enamels, lacqueurs, vinyl/acrylic resins, acrylic latexes, acrylic resins, phenolic resins and novolac/resole resins. The stripping compositions are also especially useful for stripping multiple layers of auto, airplane and metal enamels from metal substrates and are able to do so in a shorter time period and at a lower temperature than those previously used in commercial stripping compositions and methods.

The stripping compositions of this invention are especially useful and advantageous for numerous reasons among which may be mentioned the following. The stripping compositions are water rinseable, low corrosive, non-flammable and of low toxicity to humans and the environment. Because of the low ambient vapor pressure of the compositions they evidence substantially less evaporation than prior compositions and are non-reactive and environmentally compatible. The stripping compositions may be recycled for multiple use or easily disposed of in an environmentally safe manner without the necessity for burdensome safety precautions. The stripping compositions of this invention evidence higher stripping efficiency at lower temperatures for a wide variety of coatings and substrates. Moreover, the stripping compositions are easily prepared by simply mixing the components at room temperature and thus require no special human or environmental safety precautions. Furthermore, the components of the stripping compositions of this invention provide synergistic stripping action and permit readily and substantially complete removal of coatings from substrates.

The effectiveness and unexpected nature of the stripping compositions of this invention is illustrated, but not limited, by the data presented in the following example.

EXAMPLE 1

A single coat of semi-gloss oil based enamel (white) from Cook and Dunn Paint Corporation, Newark, N.J., was brushed onto test sample of birch wood at a temperature of about 21°–25° C. and permitted to cure/dry for a period of four weeks at this temperature. The wood test sample all evidenced good water absorption properties prior to painting. Following the cure/dry steps, the test samples were subjected to stripping by brushing equivalent amounts of various stripping compositions on the painted brush and resting the samples set for a specified period of time without disturbance. A soft cloth rag was then wetted with the stripping compositions and an attempt at finish removal was made by rubbing the test sample with the wetted rag.

Stripping compositions consisting solely or m-diisopropylebenezene or dodecylbenzene sulfonic acid, individually, each removed less than 50% of semi-gloss oil based enamel coating following a residence time of stripping compositions on the painted test samples of at least 8 minutes. In contradistinction, a stripping composition of this invention, consisting of 75% by weight of m-diisopropyl benzene and 25% by weight of dodecylbenzene sulfonic acid removed at least 95% of the semi-gloss oil based enamel coating after a residence time of 5 minutes and at least 100% after a residence time of 10 minutes.

EXAMPLE 2

In order to demonstrate the efficiency of the different solvent compositions as negative photoresist strippers, the following tests were performed.

Metal substrates containing commercial negative photoresists were post-baked. The substrates were cooled and dipped into a vessel containing a stripping composition of the present invention maintained at 65° C. and stirred with a magnetic stirrer. The substrate was removed and dipped into a vessel containing isopropyl alcohol maintained at room temperature for 1 minute and then rinsed with deionized water. The results were as follows:

| Test No. | Stripping Compositions % | Negative Photoresist | Post Bake/ 60 min. °C. | Stripping Results; % wafer cleared |
|---|---|---|---|---|
| A | m-diisopropyl benzene | KTI-747* | none | 0 |
|   |   | SC-100** | none | 0 |
|   |   | KTI-747 | 150 | 0 |
|   |   | SC-100 | 150 | 0 |
| B | dodecylbenzene sulfonic acid | KTI-747 | none | <50% |
|   |   | SC-100 | none | <50% |
|   |   | KTI-747 | 150 | <50% |
|   |   | SC-100 | 150 | <50% |
| C | m-diisopropyl benzene - dodecylbenzene sulfonic acid (75/25) | KTI-747 | none | 100% |
|   |   | SC-100 | none | 100% |
|   |   | KTI-747 | 150 | 100% |
|   |   | SC-100 | 150 | 100% |
| D | m-diisopropyl dodecylbenzene sulfonic acid (50/50) | KTI-747 | none | <100% |
|   |   | SC-100 | none | <100% |
|   |   | KTI-747 | 150 | <100% |
|   |   | SC-100 | 150 | <100% |

*Polyisoprene type negative resist from Eastman Kodak Co.
**negative resist from Olin-Hunt

EXAMPLE 3

The conditions for stripping were followed according to Example 2 except that the contact with the stripping composition was for 1 minute so that the conditions would fall within the ranges set forth at column 7, lines 30-52 of Pat. No. 4,276,186. The results were as follows:

| Test No. | Stripping Compositions % | Negative Photoresist | Post Bake/ 60 min. °C. | Stripping Results: % wafer cleared |
|---|---|---|---|---|
| 1 | m-diisopropyl benzene (75%) dodecylbenzene sulfonic acid (25%) | KTI-707 SC-100 | 150 150 | 100% 100% |
| 2 | dodecylbenzene sulfonic acid (70%) dodecylbenzene (30%) (Example 32) | KTI SC-100 | 150 150 | <100% <100% |
| 3 | dodecylbenzene sulfonic acid (49%) benzene sulfonic acid (21%) dodecylbenzene (30%) (Example 2) | KTI SC-100 | 150 150 | <100% <100% |

EXAMPLE 4

The operating parameters of various stripping compositions were obtained either from product literature or independent test with the following results:

| Sample I - | Composition of invention m-Diisopropylbenzene | 75% |
|---|---|---|
|   | Dodecylbenzene sulfonic acid | 25% |
| Sample II - | Composition sold by Indust-Ri-Chem Laboratory Inc. under the trade name J-100 Chlorinated aliphatic and aromatic hydrocarbons | 50% |
|   | Phenol | 10% |
|   | Benzene sulfonic acid | 40% |
| Sample III - | Composition sold by EKC Technology Inc. under the trade name Burmar Nophenol 922 | <75 |
|   | C$_9$-C$_{12}$ Paraffins, cycloparaffins, aromatics |   |
|   | Catechol | <5 |
|   | Dodecylbenzensulfonic acid | <40 |
| Sample IV - | Composition sold by EKC Technology Inc. under the trade name Burmar-712D | <25 |
|   | Dodecylbenzenesulfonic acid |   |
|   | C$_9$-C$_{12}$ Parafins, Cyclopararins, Aromatics | <25 |
|   | 1,2,4-Trichlorobenzene | <50 |
|   | Phenol | <25 |

|   | Sample | | | |
|---|---|---|---|---|
|   | I | II | III | IV |
|   | | | Resisit Type | |
|   | Neg | Pos-Neg | Pos-Neg | Pos-Neg |
| Recommended Operating Temp (°C.) | 25-85 | 90-100 | 95-105 | 95-105 |
| Flash Pt. | >85° C. | None | 63° C. | 70° C. |
| Composition Stability on Heating | Stable | Rapid Change | Rapid Change | Rapid Change |
| Recommended Bath Life (Wafers/gal) | >2000 × 4″ | <800 × 4″ | 600-800 × 4″ | 700-900 × 4″ |
| Water Rinseability | Cleanly Rinseable | Not Recommended | Rinseable | Rinseable |
| Recommended # Tanks | 3 | 4-5 | 3-4 | 3-4 |

| | Sample | | | |
|---|---|---|---|---|
| | I | II | III | IV |
| | | | Resisit Type | |
| | Neg | Pos-Neg | Pos-Neg | Pos-Neg |
| Toxicity (Acute and Chronic) | Low | High | High | High |
| Evaporation Rate (BuOAc = 1) | <<1 | >10 | >10 | >10 |
| Performance Change on Prolonged Heating | Stable | Degrades | Degrades | Degrades |
| Reactivity to Metals (Al Etch Rates)* | 25A/min (80° C.) (Strip) | 20A/min (100° C.) (Strip) | 25–30A/min (95°) (Strip) | 35–40A/min (100°) (Strip) |
| Disposal | Biodegradable Returnable | Hazardous Waste | Hazardous Waste | Hazardous Waste |

While the use of the hereinbefore recited stripping compositions of this invention has been described in connection with certain specific coatings and substrates for purposes of illustration, it will be appreciated that the stripping compositions o this invention are suitable for other stripping uses which will be apparent to those skilled in the art and can be employed with a variety of coatings on a variety of substrates in a variety of environments and industries.

What is claimed is:

1. A non-aqueous halogen and phenol free negative resist stripping composition having low toxicity and operable at temperatures of about 85° C. or less, consisting essential of about 60 to 96% by weight of diisopropylbenzene and about 4 to 40% by weight of an organic sulfonic acid of the formula:

$$R_3-SO_3H$$

wherein $R_3$ is a member selected from the group consisting of phenyl, tolyl, dodecylbenzene and naphthyl.

2. The stripping composition of claim 1, wherein said aromatic solvent is m-diisopropyl benzene.

3. The stripping composition of claim 1 wherein said organic sulfonic acid is selected from the group consisting of benzene sulfonic acid, tolylsulfonic acid, naphthyl sulfonic acid and dodecylbenzene sulfonic acid.

4. The stripping composition of claim 3 wherein said organic sulfonic acid is dodecylbenzene sulfonic acid.

5. The stripping composition of claim 1 comprising m-isopropylbenzene and dodecylbenzene sulfonic acid.

6. The stripping composition of claim 5 comprising about 80% by weight of m-isopropylbenzene and about 20% by weight of dodecylbenzene sulfonic acid.

7. A process for removing a coating from a coated substrate comprising applying to said coated substrate a stripping effective amount of a stripping composition of claim 1, permitting said stripping composition to reside on said coated substrate for a stripping effective period of time and removing 8. A process for removing a coating from a coated substrate comprising applying to said coated substrate a stripping effective amount of a stripping composition of claim 2, permitting said stripping composition to reside on said coated substrate for a stripping effective period of time and removing the coating from the substrate.

9. A process for removing a coating from a coated substrate comprising applying to said coated substrate a stripping effective amount of a stripping composition of claim 4, permitting said stripping composition to reside on said coated substrate for a stripping effective period of time and removing the coating from the substrate.

10. A process for removing a coating from a coated substrate comprising applying to said coated substrate a stripping effective amount of a stripping composition of claim 6, permitting said stripping composition to reside on said coated substrate for a stripping effective period of time and removing the coating from the substrate.

* * * * *